US012813200B2

(12) United States Patent
Goshi

(10) Patent No.: US 12,813,200 B2
(45) Date of Patent: Nov. 24, 2026

(54) SUBSTRATE PROCESSING APPARATUS AND SUBSTRATE PROCESSING METHOD

(71) Applicant: Tokyo Electron Limited, Tokyo (JP)

(72) Inventor: Gentaro Goshi, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 117 days.

(21) Appl. No.: 18/529,057

(22) Filed: Dec. 5, 2023

(65) Prior Publication Data

US 2024/0194502 A1 Jun. 13, 2024

(30) Foreign Application Priority Data

Dec. 7, 2022 (JP) ................................ 2022-195898

(51) Int. Cl.
*H10P 72/00* (2026.01)
*H10P 52/00* (2026.01)
*H10P 70/00* (2026.01)

(52) U.S. Cl.
CPC .......... *H10P 72/0448* (2026.01); *H10P 52/00* (2026.01); *H10P 70/00* (2026.01);
(Continued)

(58) Field of Classification Search
CPC ........... H01L 21/6715; H01L 21/02052; H01L 21/02101; H01L 21/304; H01L 21/67017;
(Continued)

(56) References Cited

U.S. PATENT DOCUMENTS

2002/0020344 A1* 2/2002 Takano ............... H10P 72/3411 118/100
2002/0160625 A1* 10/2002 Inoue ...................... H10P 70/15 257/E21.228
(Continued)

FOREIGN PATENT DOCUMENTS

JP 2019-033246 A 2/2019
KR 20220002125 A * 1/2022 .......... H10P 72/0604

OTHER PUBLICATIONS

KR20220002125 translation (Year: 2022).*

*Primary Examiner* — Michael E Barr
*Assistant Examiner* — Lauren G Orta
(74) *Attorney, Agent, or Firm* — Chrisman Gallo Tochtrop LLC

(57) ABSTRACT

A substrate processing apparatus includes a liquid processing device configured to supply a processing liquid onto a substrate from a nozzle and form a liquid film of the processing liquid on a surface of the substrate; a processing liquid supply comprising: a buffer tank configured to store therein the processing liquid supplied from a processing liquid source; a supply pipe configured to connect the processing liquid source, the buffer tank and the nozzle; and a supply controller configured to perform a supply and a stop of the supply of the processing liquid to the nozzle; a dissolved oxygen concentration measuring device configured to measure a dissolved oxygen concentration in the processing liquid; and a controller configured to determine whether or not to supply the processing liquid to the substrate based on a measurement result, and configured to control the supply controller based on a determination result.

17 Claims, 9 Drawing Sheets

(52) U.S. Cl.
CPC .............. *H10P 70/15* (2026.01); *H10P 70/80* (2026.01); *H10P 72/0402* (2026.01); *H10P 72/0406* (2026.01); *H10P 72/0408* (2026.01); *H10P 72/0411* (2026.01); *H10P 72/0414* (2026.01); *H10P 72/0424* (2026.01); *H10P 72/0604* (2026.01)

(58) Field of Classification Search
CPC ......... H01L 21/67028; H01L 21/67034; H01L 21/67051; H01L 21/02041; H01L 21/6708; H01L 21/67253; H01L 21/6704
See application file for complete search history.

(56) References Cited

U.S. PATENT DOCUMENTS

| | | | | |
|---|---|---|---|---|
| 2003/0180471 | A1* | 9/2003 | Takekuma .......... | H10P 72/0604<br>438/782 |
| 2003/0191551 | A1* | 10/2003 | Gotoh ................. | H10P 72/7602<br>700/121 |
| 2015/0013798 | A1* | 1/2015 | Murayama .............. | C07C 29/90<br>422/261 |
| 2015/0187561 | A1* | 7/2015 | Frank ................. | B01D 19/0031<br>134/33 |
| 2019/0295865 | A1* | 9/2019 | Hanawa .............. | H10P 72/0406 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2022-195898 filed on Dec. 7, 2022, the entire disclosures of which are incorporated herein by reference.

TECHNICAL FIELD

The various aspects and embodiments described herein pertain generally to a substrate processing apparatus and a substrate processing method.

BACKGROUND

Recently, in the manufacture of a semiconductor device, a supercritical drying processing is performed. A substrate processing apparatus described in Patent Document 1 is equipped with a single-wafer cleaning apparatus and a supercritical drying apparatus. In the cleaning apparatus, a chemical liquid cleaning process and a rinsing process are performed on a substrate. Thereafter, a rinse liquid on a surface of the substrate is replaced with a protective liquid such as IPA, and, subsequently, a thickness of a liquid film of the protective liquid on the surface of the substrate is adjusted to a proper thickness. Then, the substrate is carried into a supercritical chamber of the supercritical drying apparatus, where the liquid film of the protective liquid on the surface of the substrate is replaced with a supercritical fluid such as supercritical carbon dioxide, and the substrate is dried by vaporizing this supercritical fluid.

Patent Document 1: Japanese Patent Laid-open Publication No. 2019-033246

SUMMARY

In one exemplary embodiment, a substrate processing apparatus includes a liquid processing device, having a nozzle, configured to perform a processing on a substrate by supplying a processing liquid onto the substrate from the nozzle, the liquid processing device forming a liquid film of the processing liquid on a surface of the substrate as a pre-process for a supercritical drying processing of drying the processing liquid; a processing liquid supply configured to supply the processing liquid to the nozzle, the processing liquid supply comprising: a buffer tank configured to temporarily store therein the processing liquid supplied from a processing liquid source; a supply pipe, through which the processing liquid passes from the processing liquid source toward the nozzle, configured to connect the processing liquid source, the buffer tank and the nozzle; and a supply controller configured to at least perform a supply and a stop of the supply of the processing liquid to the nozzle; a dissolved oxygen concentration measuring device provided in the supply pipe or in a drain pipe branched off from the supply pipe, and configured to measure a dissolved oxygen concentration in the processing liquid present in the supply pipe or in the processing liquid taken out from the supply pipe through the drain pipe; and a controller configured to determine whether or not to supply the processing liquid from the nozzle to the substrate based on a measurement result of the dissolved oxygen concentration measuring device, and configured to control the supply controller based on a determination result.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
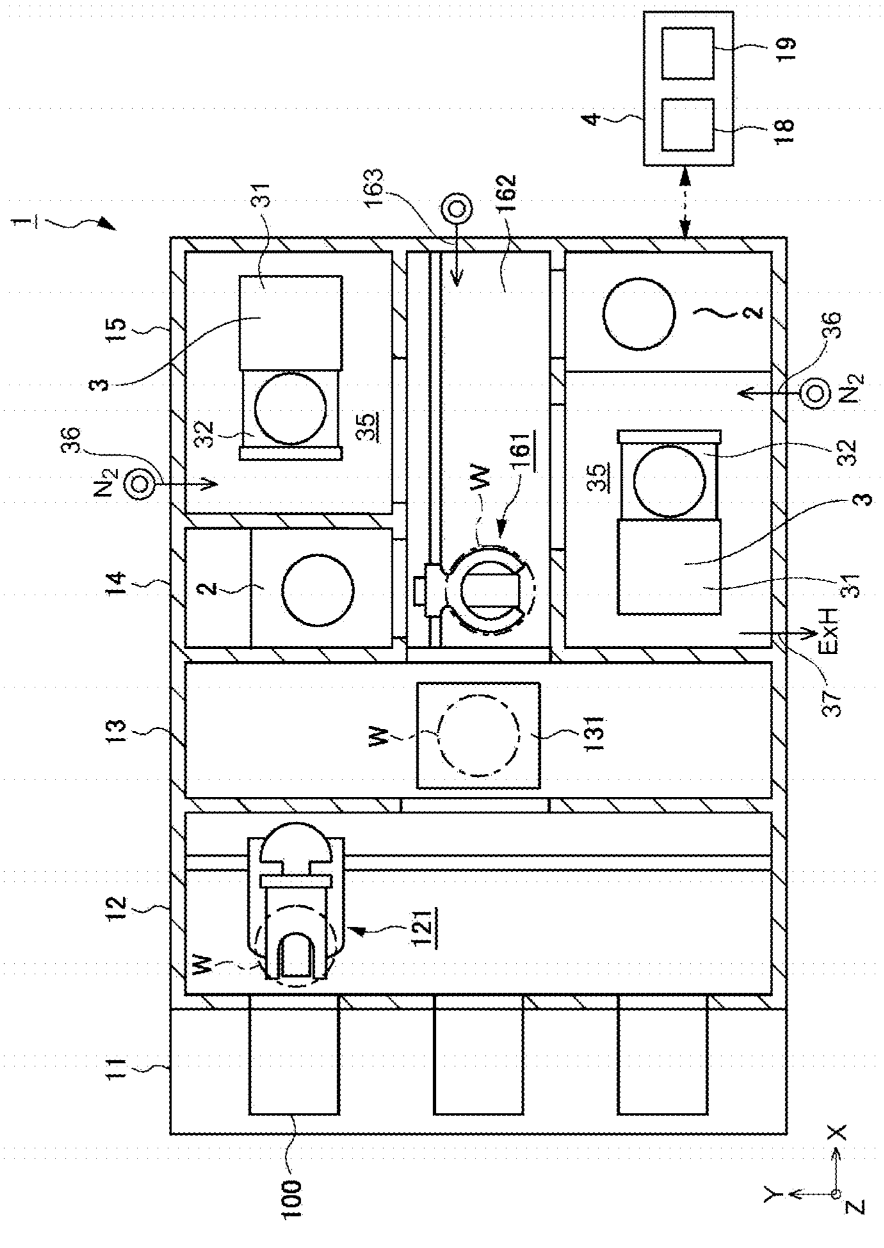
FIG. 1 is a schematic transversal cross sectional view of a substrate processing system according to an exemplary embodiment of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing system according to an exemplary embodiment of a substrate processing apparatus will be described with reference to the accompanying drawings.

As depicted in FIG. 1, a substrate processing system 1 is equipped with a plurality of (two in the example shown in FIG. 1) liquid processing devices (liquid processors) 2 and a plurality of (two in the example shown in FIG. 1) supercritical processing devices (supercritical processors) 3.

In this substrate processing system 1, a FOUP (Front-Opening Unified Pod) 100 (substrate transfer container) accommodating therein a plurality of substrates W is disposed in a placing section 11, and the substrates W in the FOUP 100 are delivered to a cleaning section 14 and a supercritical processing section 15 via a carry-in/out section 12 and a delivery section 13. In the cleaning section 14 and the supercritical processing section 15, the substrate W is first carried into the liquid processing device 2 provided in the cleaning section 14 to be subjected to a cleaning processing, and is then carried into the supercritical processing device 3 provided in the supercritical processing section 15 to be subjected to a drying processing of removing IPA from the substrate W. In FIG. 1, a reference numeral '121' denotes a first transfer mechanism configured to transfer the substrate W between the FOUP 100 and the delivery section 13, and a reference numeral '131' denotes a delivery shelf serving as a buffer in which the substrate W which is transferred between the carry-in/out section 12 and the cleaning section 14/supercritical processing section 15 is temporarily placed.

A substrate transfer path 162 is connected to an opening of the delivery section 13, and the cleaning sections 14 having the liquid processing devices 2 and the supercritical processing sections 15 having the supercritical processing devices 3 are disposed on both sides of the substrate transfer path 162. A second transfer mechanism 161 is disposed in the substrate transfer path 162, and this second transfer mechanism 161 is configured to be movable within the substrate transfer path 162. The substrate W placed on the delivery shelf 131 is received by the second transfer mechanism 161, and the second transfer mechanism 161 carries the substrate W into the liquid processing device 2 and the supercritical processing device 3. In addition, the numbers and the layouts of the liquid processing devices 2 and the supercritical processing devices 3 are not particularly limited, and an appropriate number of liquid processing devices 2 and an appropriate number of supercritical processing devices 3 are arranged in an appropriate layout based on the number of substrates W processed per unit time, processing times of each liquid processing device 2 and each supercritical processing device 3, and so forth.

The substrate processing system 1 is equipped with a controller 4. The controller 4 is implemented by, for example, a computer, and includes an operation processor 18 and a storage 19. The storage 19 stores therein a program (including a processing recipe) that controls various processings performed in the substrate processing system 1. The operation processor 18 reads and executes the program stored in the storage 19 to control an operation of the substrate processing system 1.

Figure 2:
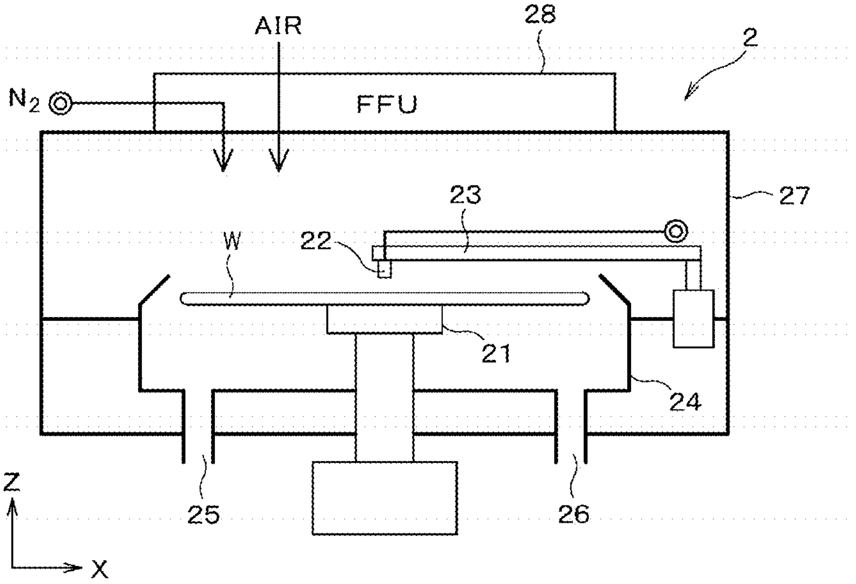
FIG. 2 is a schematic longitudinal cross sectional view illustrating a configuration example of a liquid processing device belonging to the substrate processing system of FIG. 1.

A single-wafer liquid processing device commonly known in the technical field of semiconductor manufacturing equipment may be used as the liquid processing device 2. A configuration example of the liquid processing device 2 that can be used in the present exemplary embodiment will be briefly described below with reference to FIG. 2. The liquid processing device 2 includes a spin chuck 21 (substrate holding/rotating mechanism) capable of holding the substrate W horizontally and rotating it around a vertical axis; and one or more nozzles 22 configured to discharge a processing liquid onto the substrate W held and rotated by the spin chuck 21. The nozzle 22 is supported on an arm 23 configured to move the nozzle 22. The liquid processing device 2 also has a liquid receiving cup 24 configured to collect the processing liquid scattered from the substrate W being rotated. The liquid receiving cup 24 has a drain port 25 through which the collected processing liquid is drained to the outside of the liquid processing device 2; and an exhaust port 26 through which an atmosphere within the liquid receiving cup 24 is exhausted. A clean gas is discharged downwards from a fan filter unit 28 provided at a ceiling portion of a chamber 27 of the liquid processing device 2, drawn into the liquid receiving cup 24, and exhausted through the exhaust port 26.

As the fan filter unit 28, one having a function of selectively discharging clean air and an inert gas such as, but not limited to, a nitrogen gas (also referred to as 'N2 gas') may be used. In this case, air in a clean room where the substrate processing system 1 is provided is filtered by a filter (for example, a ULPA filter) in the fan filter unit 28, and this filtered air is used as the clean air. As the nitrogen gas, one supplied from a nitrogen gas source provided as a factory supply of a semiconductor manufacturing factory is used. The fan filter unit 28 having such a function is commonly known in the technical field of semiconductor manufacturing equipment, so a detailed description of its structure will be omitted here.

Figure 3:
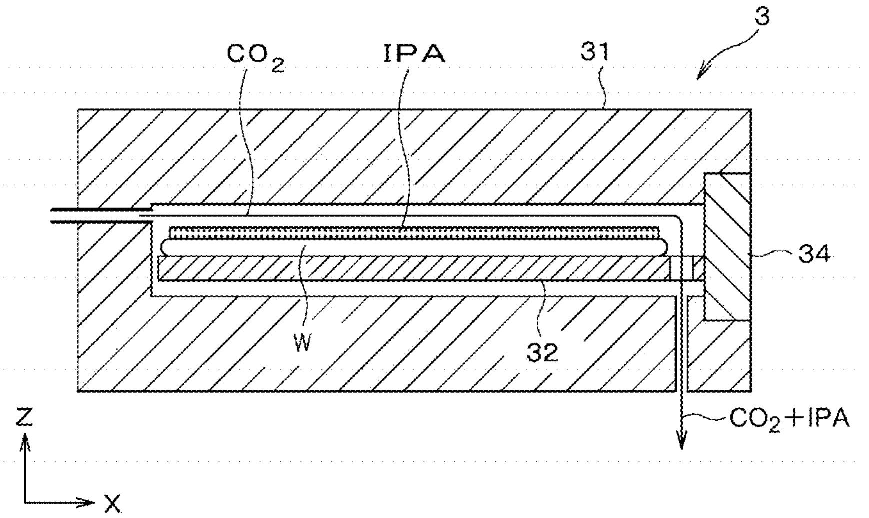
FIG. 3 is a schematic longitudinal cross sectional view illustrating a configuration example of a supercritical processing device belonging to the substrate processing system of FIG. 1.

As the supercritical processing device 3, any one known in the technical field of semiconductor manufacturing equipment may be used. A configuration example of the supercritical processing device 3 that can be used in the present exemplary embodiment will be briefly explained below with reference to FIG. 3. The supercritical processing device 3 has a supercritical chamber (processing vessel) 31; and a substrate support tray 32 configured to be moved back and forth with respect to the supercritical chamber 31. As shown in FIG. 3, when the substrate support tray 32 supporting the substrate W thereon is accommodated in the supercritical chamber 31, a cover body 34 integrated with the substrate support tray 32 closes an opening of the supercritical chamber 31, so that a sealed processing space is formed within the supercritical chamber 31. FIG. 1 illustrates the substrate support tray 32 retreated from the supercritical chamber 31, and, in this state, the second transfer mechanism 161 can transfer the substrate W to the substrate support tray 32.

To create a nitrogen gas atmosphere in a region 35 within the supercritical processing device 3 in which the substrate W is handed over to the substrate support tray 32, there may be provided a nitrogen gas supply 36 configured to supply a nitrogen gas into the region 35. By supplying the nitrogen gas into the supercritical chamber 31 when the opening of the supercritical chamber 31 is opened, both the inside of the supercritical chamber 31 and the region 35 may be set into the nitrogen gas atmosphere. Further, in order to accelerate purging of the nitrogen gas in the region 35, an exhaust device (not shown) configured to exhaust the atmosphere of the region 35 may be provided.

Below, a processing on the substrate W performed in the liquid processing device 2 and the supercritical processing device 3 will be briefly described. The substrate W carried into the liquid processing device 2 by the second transfer mechanism 161 is held horizontally by the spin chuck 21, and rotated around the vertical axis. A processing liquid is supplied onto a surface of the substrate W being rotated from one of the nozzles 22 according to a preset processing recipe. As an example, the substrate W is sequentially subjected to a pre-wet processing with a pre-wet liquid, a chemical liquid processing with a chemical liquid for cleaning or wet etching, and a rinsing processing with a rinse liquid (for example, DIW). The chemical liquid processing and the rinsing processing may be performed multiple times. Upon the completion of the last rising processing, IPA as a protective liquid (processing liquid) configured to protect the surface of the substrate is supplied from the nozzle 22 (IPA nozzle 22) configured to supply the IPA onto the surface of the substrate W being rotated for a predetermined period of time. As a result, the rinse liquid on the surface (including the inside of a pattern) of the substrate W is replaced with the IPA. Upon the completion of the replacement with the IPA, a rotation speed of the substrate W is reduced to an extremely low level, and a discharge flow rate of the IPA from the IPA nozzle 22 is also reduced to an appropriate value. Ultimately, the discharge of the IPA is stopped, and the rotation of the substrate W is also stopped. As a result, an IPA liquid film (also referred to as "IPA puddle") having a required film thickness is formed on the surface of the substrate W. The substrate W having the IPA puddle formed on the surface thereof is transferred to the supercritical processing device 3 by the second transfer mechanism 161.

The second transfer mechanism 161 places the substrate W having the IPA puddle formed on the surface thereof on the substrate support tray 32 that is located at an opening position (the position shown in FIG. 1). Subsequently, the substrate support tray 32 is moved to a closing position (the position shown in FIG. 3), and the substrate W is accommodated in the sealed processing space within the supercritical chamber 31. Further, the supercritical chamber 31 is made of a material such as thick stainless steel, and always is maintained at a temperature of about 80° C. during an operation of the substrate processing system 1. $CO_2$ is supplied into the supercritical chamber 31 from a supercritical $CO_2$ (supercritical carbon dioxide) supply device, so that an internal pressure of the supercritical chamber 31 increases. When the internal pressure of the supercritical chamber 31 exceeds a threshold pressure (here about 8 MPa) of the $CO_2$, the $CO_2$ begins to be dissolved in the IPA on the substrate W.

Regardless of a concentration and a temperature of the IPA in a mixed fluid ($CO_2$+IPA) on the substrate W, the internal pressure of the supercritical chamber 31 is raised until it reaches a supercritical state guaranteeing pressure at which the $CO_2$ in the supercritical chamber 31 is maintained in a supercritical state. Then, there is performed a flowing process of carrying on the supply of the $CO_2$ into the supercritical chamber 31 while draining the fluid from the supercritical chamber 31 at a flow rate allowing the supercritical state guaranteeing pressure to be maintained.

In the flowing process, the supercritical $CO_2$ flows through a space above the substrate and is then drained from a fluid drain, as indicated by an arrow of FIG. 3. At this time, a laminar flow of the supercritical $CO_2$ flowing substantially in parallel with the surface of the substrate W is formed within the supercritical chamber 31. The IPA in the mixed fluid (IPA+$CO_2$) on the surface of the substrate W exposed to the laminar flow of the supercritical $CO_2$ gets replaced with the supercritical $CO_2$. Ultimately, almost all of the IPA on the surface of the substrate W is replaced with the supercritical $CO_2$.

When the replacement of the IPA with the $CO_2$ is completed, the supply of the supercritical $CO_2$ is stopped, and the fluid is drained from the supercritical chamber 31, so that the internal pressure of the supercritical chamber 31 is returned to a normal pressure. As a result, the $CO_2$ in the supercritical state turns into a gas and is removed from the substrate W, and drying of the substrate W is completed. The dried substrate W is carried out from the supercritical processing device 3 by the second transfer mechanism 161.

Figure 4:
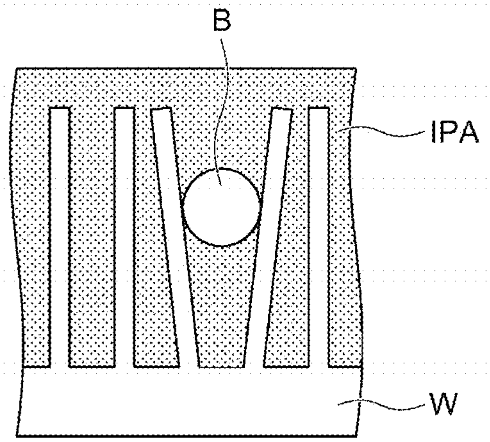
FIG. 4 is a schematic diagram for describing pattern collapse caused by dissolved oxygen in IPA.

In the above-described process, when the substrate W is accommodated in the supercritical chamber 31 whose temperature is maintained constant at about 80° C., the temperature of the substrate W increases, so that some of the gas (particularly, an oxygen gas) dissolved in the IPA on the surface of the substrate W vaporizes, resulting in generation of bubbles. As shown in FIG. 4, if a large bubble B is generated in a space between adjacent columnar portions of the pattern, there is a risk that the space between the adjacent columnar portions may be widened due to the bubble B, causing a collapse of the pattern.

For this reason, a dissolved oxygen concentration (hereinafter, also referred to as 'DO' or 'DO value' for simplicity) in the IPA needs to be kept low. Furthermore, dissolution of carbon dioxide can be a problem. Since, however, a carbon dioxide concentration in the air is significantly lower than an oxygen concentration therein, it is unlikely to cause a problem. Additionally, nitrogen, which is most abundant in the air, does not cause a problem because its solubility in the IPA is significantly lower than that of the oxygen and the carbon dioxide.

In order to solve the problem of the bubbles mentioned above, the present disclosure provides a technique capable of reducing the dissolved oxygen concentration of the IPA on the surface of the substrate W, particularly a technique capable of supplying IPA having a low dissolved oxygen concentration onto the substrate.

Hereinafter, an IPA supply mechanism (processing liquid supply) capable of supplying IPA of a low DO to the nozzle 22 for IPA supply (IPA nozzle 22) of the liquid processing device 2 will be described.

A first configuration example of the IPA supply mechanism will be described with reference to FIG. 5. An IPA supply mechanism 40 according to the first configuration example has an IPA source 41. The IPA source 41 may have any of various configurations as long as it is capable of supplying IPA having a sufficiently low DO value.

The IPA source 41 may be provided as a factory supply of a semiconductor device manufacturing factory where the substrate processing system 1 is provided. Alternatively, the IPA source 41 may be an airtight container (also called a 'canister', etc.) in which the IPA of the low DO is stored. The example shown in FIG. 5 is the latter case. In this case, the airtight container constituting the IPA source 41 will also be referred to as 'airtight container 41'.

By supplying a force-feed gas to a space above a liquid level of the IPA in the airtight container 41, the IPA in the airtight container 41 is pushed into an end opening of an IPA supply pipe 42 opened below the liquid level of the IPA by the pressure of the force-feed gas, and is thereby pushed out from the airtight container 41. This technique itself of force-feeding a liquid by using a gas is well known in the art.

It is desirable to use a gas whose solubility in the IPA is lower than that of the oxygen gas as the force-feed gas. Here, it is assumed that an inert gas such as, but not limited to, a nitrogen gas ($N_2$ gas) is used as the force-feed gas. In FIG. 5, the force-feed gas is assigned a reference numeral '$N_2$ (D)'.

The IPA supply pipe 42 is provided with an opening/closing valve 431 and a filter 432 in sequence from the upstream side. The opening/closing valve 431 is opened when the IPA is sent out from the airtight container 41, and is kept closed at other times. The filter 432 serves to remove a particle included in the IPA.

A downstream end of the IPA supply pipe 42 is connected to a buffer tank 44. The IPA can be replenished from the airtight container 41 into the buffer tank 44 via the IPA supply pipe 42.

A force-feed gas supply 45 is configured to supply the force-feed gas to the buffer tank 44. The force-feed gas supply 45 includes a force-feed gas supply pipe 451, and a pressure control valve 452, a gas filter 453, and an opening/closing valve 454 provided in the force-feed gas supply pipe 451 in sequence from the upstream side. The pressure control valve 452 has a function as a decompression valve that controls a secondary pressure of the pressure control valve 452 itself. The gas filter 453 is configured to remove a particle contained in the force-feed gas. The opening/closing valve 454 is opened when the IPA is discharged from the nozzle 22 for IPA discharge in the liquid processing device 2, and is kept closed at other times.

An upstream end of the force-feed gas supply pipe 451 is connected to a force-feed gas source 456, and a downstream end of the force-feed gas supply pipe 451 is connected to the buffer tank 44. A force-feed gas supplied from the force-feed gas source 456 may be the same as the force-feed gas supplied to the airtight container 41, and may be, for example, a nitrogen gas. Further, in order to supply the force-feed gas to the airtight container 41, a force-feed gas supply identical to the force-feed gas supply 45 may be connected to the airtight container 41.

An IPA supply pipe 46 is connected to a bottom portion of the buffer tank 44. A downstream end of the IPA supply pipe 46 is connected to the nozzle 22 for IPA discharge in the liquid processing device 2. The IPA supply pipe 46 is provided with a flowmeter 461 and an opening/closing valve 462 provided in sequence from the upstream side. The opening/closing valve 462 is opened when the IPA is discharged from the nozzle 22 for IPA discharge, and is kept closed at other times. A discharge flow rate of the IPA from the nozzle 22 may be controlled by controlling the secondary pressure of the pressure control valve 452, that is, the pressure of the force-feed gas supplied to the buffer tank 44 based on a detection value of the flowmeter 461.

Figure 5:
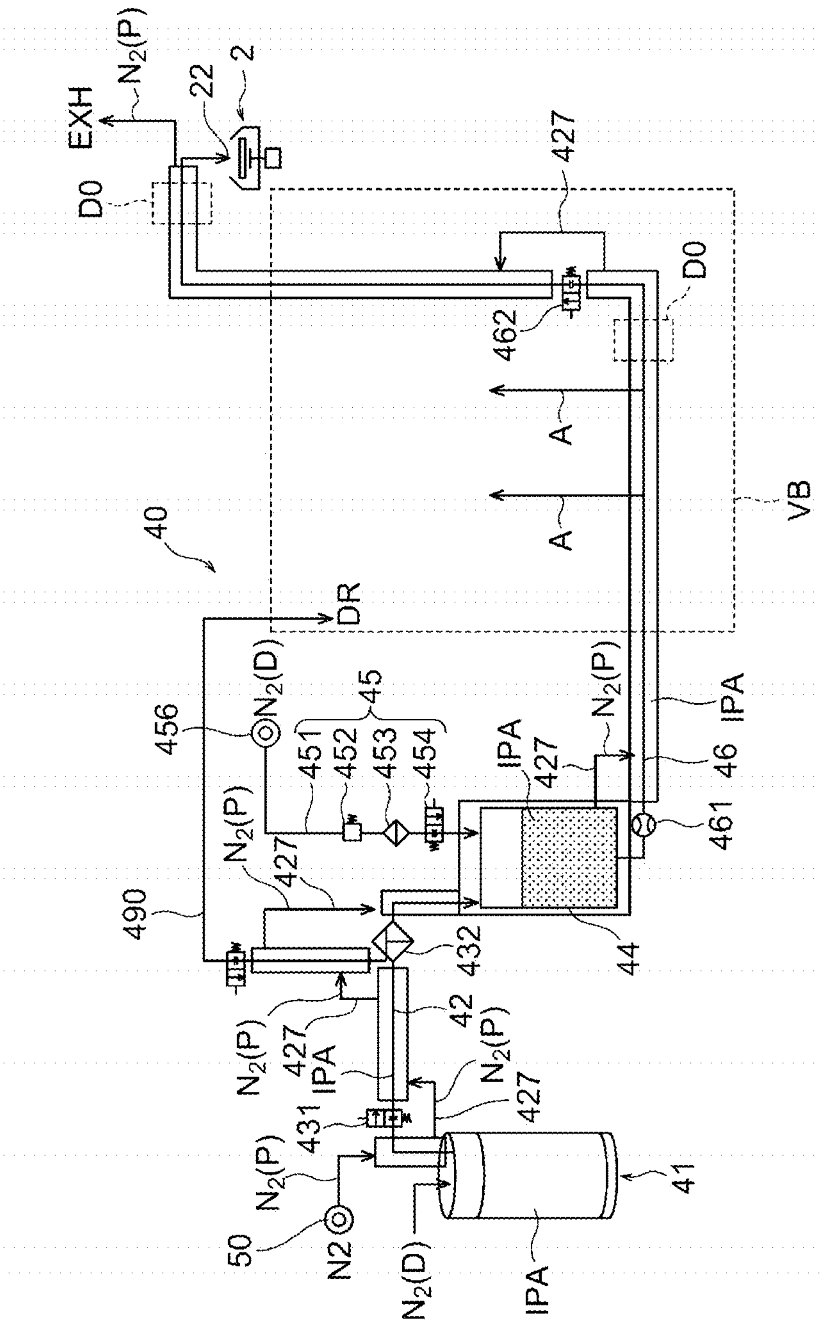
FIG. 5 is a schematic pipeline system diagram illustrating a first configuration example of an IPA supply mechanism configured to supply IPA as a processing liquid to the liquid processing device shown in FIG. 2.

As schematically indicated by arrows A in FIG. 5, a plurality of branch pipes may be branched off from the IPA supply pipe 46, and each branch pipe may be connected to the nozzle 22 for IPA discharge belonging to one of the plurality of liquid processing devices 2. In this case, the pressure of the force-feed gas supplied to the buffer tank 44 may be maintained constant by using the pressure control valve 452, and the discharge flow rate of the IPA from each nozzle 22 may be controlled by a flow rate control mechanism provided in each branch pipe. In addition, in this case, a section in which the plurality of branch pipes and various accompanying flow control devices (valves, flowmeters, etc.) are gathered together is provided in the substrate processing system 1, and this section is indicated by a dashed line VB in FIG. 5.

Furthermore, when force-feeding the IPA to the plurality of liquid processing devices 2 simultaneously by the nitrogen gas from the single buffer tank 44, it is necessary to increase the pressure of the force-feeding gas. If the pressure of the force-feeding gas is set too high, however, a non-negligible amount of nitrogen gas will be dissolved in the IPA, and there is a risk that this dissolved nitrogen gas may generate a bubble large enough to cause a problem when the substrate is introduced into the supercritical chamber 31. For this reason, when force-feeding the IPA by the nitrogen gas to the plurality of liquid processing devices 2 from the single buffer tank 44 at the same time, it is desirable to flow the IPA by a pump (see a configuration example of FIG. 11 to be described later).

Additionally, in the IPA supply mechanism 40 according to the first configuration example, the force-feeding gas supply 45, the flowmeter 461, the opening/closing valve 462, and the like constitute together a supply controller configured to control the supply of the IPA to the nozzle 22.

In a liquid processing apparatus for use in semiconductor manufacturing, pipelines used for the supply of the IPA and components (members in which the IPA is present, such as a tank and a valve box of a valve) of the IPA supply mechanism 40 attached thereto are made of, in most cases, a fluorine-based resin material such as, but not limited to, perfluoroalkoxy (PFA). Hereinafter, for the sake of simplicity of explanation, these components will also be referred to as 'PFA components', but this does not limit them to being made of PFA.

Since the PFA has gas permeability (oxygen permeability), if the IPA is left inside the PFA component for a relatively long time, oxygen contained in a surrounding atmospheric atmosphere will permeate a wall of the PFA component to be dissolved in the IPA inside the PFA component. As a result, the DO value of the IPA increases. The staying of the IPA that causes this problem occurs when the operation of the liquid processing device 2 is stopped for a relatively long period of time, for example.

In order to solve the aforementioned problem, in the present exemplary embodiment, an inert gas atmosphere, specifically, a nitrogen gas atmosphere is created around the PFA component through which the IPA passes. To this end, the PFA component is surrounded by an enclosing member, and a nitrogen gas is flown into the enclosing member. Any gas whose solubility with respect to the IPA is lower than that of an oxygen gas may be used as the gas that is flown into the enclosing member. Here, the nitrogen gas is used due to its high availability in the semiconductor manufacturing factory.

Although it is desirable that the enclosing member is impermeable to oxygen, it does not have to be completely impermeable to oxygen. For example, if the nitrogen gas is constantly flowing in the enclosing member (even at a small flow rate), an increase of an oxygen concentration in a space inside the enclosing member that might be caused by the oxygen passing through the enclosing member is negligible.

Hereinafter, various configuration examples in which the inert gas atmosphere is created around the PFA component will be described.

Figure 6:
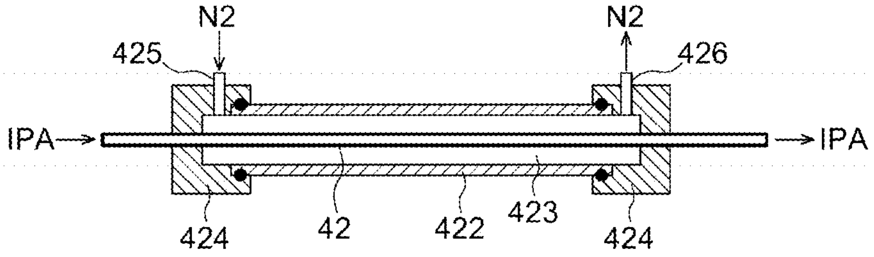
FIG. 6 is a lengthwise cross sectional view illustrating a first configuration example of an enclosing member.

In the first configuration example, as shown in FIG. 6, the IPA supply pipe 42 may be configured as an inner pipe of a dual-pipe structure. That is, an outer pipe 422 that is concentric with the IPA supply pipe 42 may be provided around the IPA supply pipe 42 (inner pipe) made of PFA.

The IPA flows within the IPA supply pipe 42, which is the inner pipe, and the nitrogen gas flows within a gas flow path 423 formed between the IPA supply pipe 42 and the outer pipe 422. In this case, the outer pipe 422 serves as the enclosing member. In the configuration example shown in FIG. 6, caps 424 each having a through hole for allowing the IPA supply pipe 42 to pass therethrough are provided at both ends of the outer pipe 422. A supply port 425 through which the inert gas is supplied to the gas flow path 423 is provided at one of the caps 424, and an exhaust port 426 through which the inert gas is exhausted from the gas flow path 423 is provided at the other of the caps 424.

Figure 7:
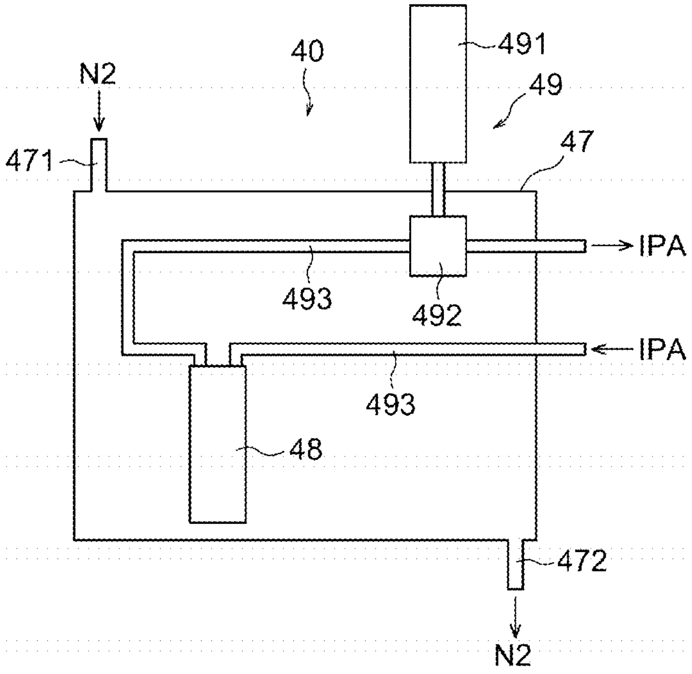
FIG. 7 is a schematic diagram illustrating a second configuration example of the enclosing member.

In a second configuration example, a sealing housing 47 may be configured to surround the components of the plurality of IPA supply mechanisms 40, as schematically shown in FIG. 7. FIG. 7 shows an example in which a filter 48, a member 492 (valve box) of an opening/closing valve 49 excluding an actuator 491, and a pipe 493 are accommodated in the sealing housing 47. The sealing housing 47 is provided with a supply port 471 through which the inert gas is supplied into a space within the sealing housing 47 and an exhaust port 472 through which the inert gas is exhausted from the space. The sealing housing 47 may be configured to surround all or almost all of the components of the plurality of IPA supply mechanisms 40. In this case, the sealing housing 47 serves as the enclosing member.

Figure 8:
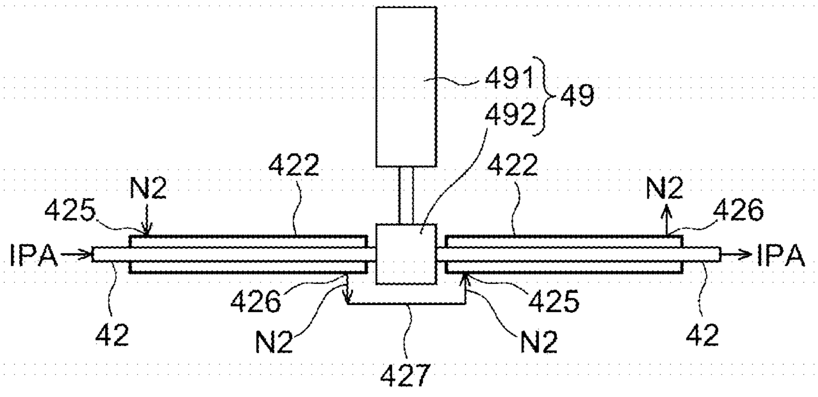
FIG. 8 is a schematic diagram illustrating a third configuration example of the enclosing member.

In a third configuration example, as schematically shown in FIG. 8, when a device such as the opening/closing valve 49 is located between pipes, the dual-pipe structure (42+422) shown in FIG. 6 may be provided at both sides of the opening/closing valve 49, and the exhaust port 426 of one of the outer pipes 422 and the supply port 425 of the other of the outer pipes 422 may be connected by a connection pipe 427. In this way, by using the connection pipe 427, internal spaces of the two adjacent enclosing members may be configured to communicate with each other.

Figure 9:
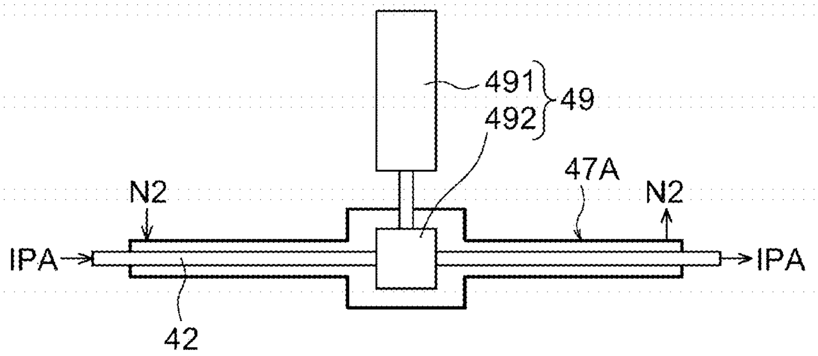
FIG. 9 is a schematic diagram illustrating a modification example of the third configuration example of the enclosing member.

Instead of this configuration, as illustrated in FIG. 9, an integrated sealing housing 47A may be configured to surround the pipe (indicated by the reference numeral 42) through which the IPA flows on both sides of the opening/closing valve 49 and the member 492 (valve box) of the opening/closing valve 49. In this case, the integrated sealing housing 47A serves as the enclosing member.

Figure 10:
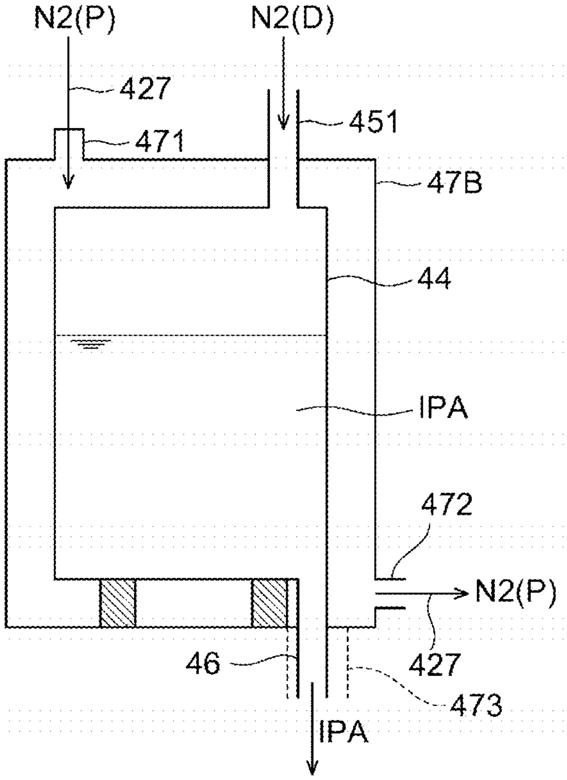
FIG. 10 is a schematic diagram illustrating a modification example of a fourth configuration example of the enclosing member.

FIG. 10 illustrates, as a fourth configuration example, a sealing housing 47B as the enclosing member surrounding the buffer tank 44. A nitrogen gas $N_2$(P) is supplied to the supply port 471 provided in the sealing housing 47B through the connection pipe 427, and the nitrogen gas $N_2$(P) is exhausted from the exhaust port 472 through the connection pipe 427. The IPA is flown out from the buffer tank 44 into the IPA supply pipe 46 due to the pressure of the nitrogen gas $N_2$(D) supplied to the buffer tank 44 from the force-feed gas supply pipe 451.

As a modification example of the configuration example of FIG. 10, a pipe 473 (indicated by a dashed line) (which also corresponds to the enclosing member) with a diameter larger than that of the IPA supply pipe 46 may be connected to a bottom of the sealing housing 47B to surround the IPA supply pipe 46. In this case, the exhaust port 472 is not provided, and an exhaust port is provided at an end of the pipe 473 having the larger diameter, and the connection pipe 427 is connected to this exhaust port.

Reference is made back to FIG. 5. Enclosing members may be provided around the opening/closing valve 431 and the opening/closing valve 462 in the manner shown in FIG. 8 or FIG. 9. An enclosing member may be provided around the buffer tank 44 in the manner shown in FIG. 10. Around the filter 432, the exhaust port 426 of the enclosing member (outer pipe 422) provided around the IPA supply pipe 42 (inner pipe 421) is connected via the connection pipe 427 to a supply port of an enclosing member provided around a gas removing pipe 490 of the filter 432. An exhaust port of the enclosing member provided around the gas removing pipe 490 is connected to, as shown in FIG. 5 and FIG. 10, a supply port 471 of the sealing housing 47B via the connection pipe 427.

In the configuration example of FIG. 5, every two adjacent enclosing members among the plurality of enclosing members are connected to each other by the connection pipe 427, and the inert gas (nitrogen gas $N_2$(P)) supplied from the inert gas supply 50 is allowed to flow unobstructed from near the airtight container 41 to near the nozzle 22 at once. With this configuration, consumption of the inert gas can be reduced. Additionally, in a region where devices such as pipes and valves are densely arranged, it is desirable to provide an enclosing member in the manner shown in FIG. 7. Further, the inert gas supply 50 is, for example, a nitrogen gas source provided as a factory supply.

Figure 11:
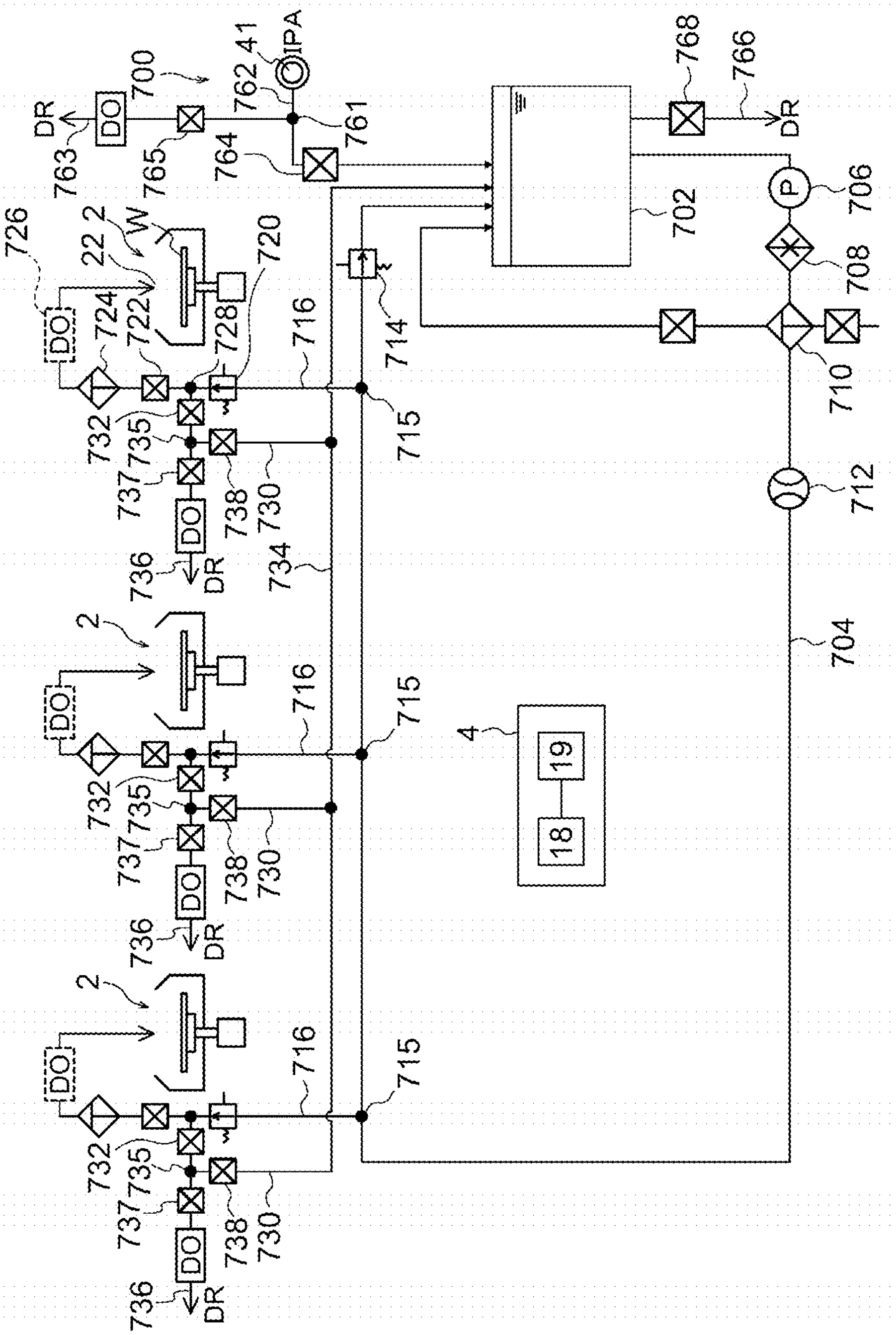
FIG. 11 is a schematic pipeline system diagram illustrating a second configuration example of the IPA supply mechanism configured to supply the IPA as the processing liquid to the liquid processing device shown in FIG. 2.

Referring to FIG. 11, an IPA supply mechanism 700 according to a second configuration example will be described. In FIG. 11, for the simplicity of illustration, the number of the liquid processing devices 2 to which the IPA is supplied is assumed to be three. However, it is apparent that the number of the liquid processing devices 2 to which the IPA is supplied is not limited thereto.

The IPA supply mechanism 700 has a tank (buffer tank) 702 configured to store IPA therein; and a circulation line 704 connected to the tank 702. The circulation line 704 is provided with a pump 706, a temperature controller 708, a filter 710, a flowmeter 712, and a constant-pressure valve 714 in sequence from the upstream side. The pump 706 pressurizes the IPA and pumps it out, thus forming a circulating flow of the IPA in the circulation line 704. The temperature controller 708 adjusts the temperature of the IPA to a temperature suitable for use in the liquid processing device 2 as a supply destination of the IPA. The filter 710 removes a contaminant such as a particle from the IPA. The constant-pressure valve 714 enables the IPA to be introduced into the liquid processing device 2 as the destination of the IPA at an appropriate pressure.

A plurality of branch points 715 are set in the circulation line 704, and a branch supply line 716 is branched off from the circulation line 704 at each branch point 715. A downstream end of each branch supply line 716 is connected to the nozzle 22 for IPA supply in the corresponding single-wafer liquid processing device 2. The branch supply line 716 is provided with a constant-pressure valve 720, an opening/closing valve 722, and a dissolved gas filter (for example, a hollow fiber membrane filter) 724 in sequence from the upstream side. A branch return line 730 is branched off from each branch supply line 716 at a branch point 728 set in the branch supply line 716, and each branch return line 730 is provided with an opening/closing valve 732. The plurality of branch return lines 730 join each other to form a single return line 734, and a downstream end of this return line 734 is connected to the tank 702.

The IPA is supplied to the tank 702 from the IPA source 41 via an IPA supply line (IPA supply pipe) 762. The IPA supply line 762 is provided with an opening/closing valve 764. A drain line 766 is connected to the tank 702 and is provided with an opening/closing valve 768.

Figure 12:
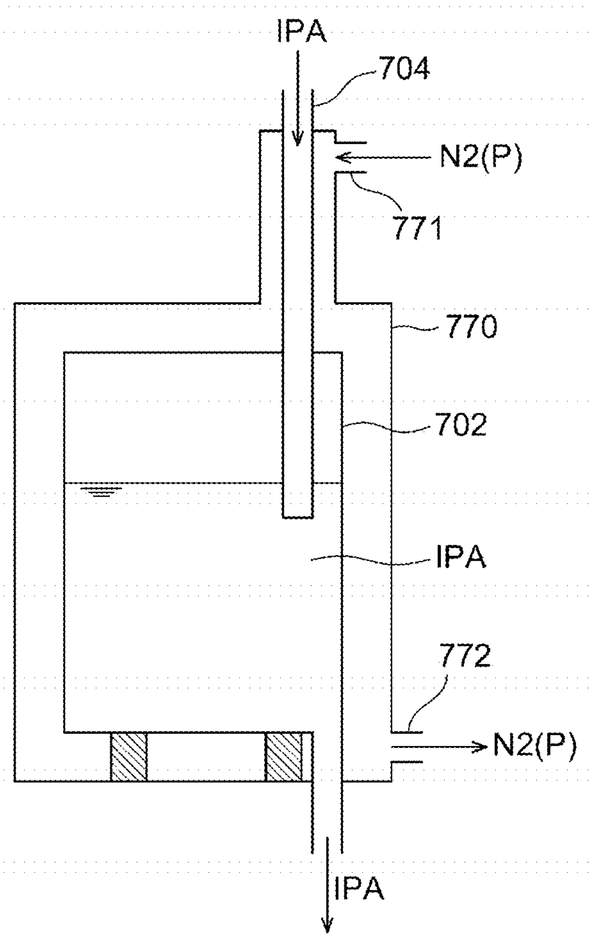
FIG. 12 is a schematic diagram illustrating a configuration example of an enclosing member provided around a buffer tank shown in FIG. 11.

In this second configuration example of the IPA supply mechanism as well, it is desirable to provide the same enclosing member as those of the first to third configuration examples around a pipe (a member called a 'line') through which the IPA flows and members attached thereto, and to flow an inert gas (nitrogen gas) inside the enclosing members. Further, as schematically shown in FIG. 12, a sealing housing 770 as the enclosing member may be provided around the tank (buffer tank) 702. In this case, a nitrogen gas is supplied from a supply port 771 into the sealing housing 770, and exhausted from an exhaust port 772.

In the second configuration example of the IPA supply mechanism, the constant-pressure valve 720, the opening/closing valve 722, the opening/closing valve 732, and so forth constitute together a supply controller configured to control the supply of IPA to the nozzle 22.

Now, an operation of the IPA supply mechanism 700 in the second configuration example will be described. When a predetermined amount of IPA is supplied from the IPA source 41 to the tank 702 to be collected in the tank 702, the pump 706 is driven, causing the IPA to be circulated through the circulation line 704. The temperature controller 708 heats the IPA flowing through the circulation line 704 to maintain it at an appropriate temperature.

Also, at this time, by closing the opening/closing valve 722 while opening the opening/closing valve 732, the IPA flowing through the circulation line 704 is introduced into each branch supply line 716 and then into each corresponding branch return line 730 to be returned to the tank 702 through the return line 734. This state is also called 'discharging standby state'.

The IPA supply mechanism shown in FIG. 11 is provided with a DO sensor configured to measure the dissolved oxygen concentration in the IPA. In FIG. 11, first to third positions (but not limited thereto) where the DO sensors can be provided are marked by white rectangles with letters 'DO' written inside.

The first position of the DO sensor is on a drain line (drain pipe) 736 branched off from the branch return line 730 at a branch point 735 set on the branch return line 730. By opening an opening/closing valve 737 provided in the drain line 736 while closing the opening/closing valve 738 provided in the branch return line 730, the IPA flowing in the branch return line 730 can be flown into the drain line 736. The DO sensor at the first position is configured to measure the dissolved oxygen concentration in the IPA flowing in the drain line 736.

For example, a detection value of the DO sensor provided at the first position may be used to ensure a state that the DO value of the IPA circulating through the circulation line 704 and the branch return line 730 is stably below a predetermined threshold value. This detection value may be used as a criterion for the controller 4 to determine whether or not to start the discharge of the IPA from the nozzle 22 to the substrate W as described above, for example. When the DO value of the IPA is found to be stably below the predetermined threshold value, the controller 4 switches the opening/closing valve 722 and the opening/closing valve 732 from the aforementioned discharging standby state to a discharging state (in which the opening/closing valve 722 is opened while the opening/closing valve 732 is closed), allowing the IPA to be discharged onto the substrate W from the nozzle 22 for IPA discharge.

It is also possible to provide the DO sensor on the branch return line 730. However, there is a likelihood that a metal component may be eluted from the DO sensor into the IPA. The IPA is the last liquid supplied to the substrate W in the liquid processing device 2, and if there is any metal component dissolved in the IPA, there is no opportunity to wash it away. For this reason, metal contamination of the IPA needs to be avoided as much as possible. For this reason, in the present exemplary embodiment, the DO sensor is disposed downstream of the opening/closing valve 737 of the drain line 736, not the branch return line 730 through which the IPA is always circulating during a normal operation of the substrate processing system 1. Thus, when the opening/closing valve 737 is closed and the IPA flows toward the tank 702 through the branch return line 730 and the return line 734, the IPA does not reach the DO sensor at the first position. In addition, the IPA that has passed through the drain line 736 for the measurement of the DO value is discarded into an organic chemical liquid drain path, which is provided in the semiconductor manufacturing factory where the substrate processing system 1 is provided.

The second position of the DO sensor is near the nozzle 22 (upstream of the nozzle 22) on the branch supply line 716.

A detection value of the DO sensor provided at the second position may be used as a criterion for determining whether or not to perform dummy dispensing. For example, if the detection value of the DO sensor provided at the second position is higher than a predetermined threshold value and the detection value of the DO sensor provided at the first position is lower than the predetermined threshold, there may be made a determination that the discharge of the IPA from the nozzle 22 onto the substrate W is enabled by performing the dummy dispensing of draining the IPA remaining in the branch supply line 716 near the nozzle 22.

The detection value of the DO sensor provided at the second position may also be used to monitor the DO value of the IPA discharged from the nozzle 22 onto the substrate W. If the DO value becomes higher than a preset threshold value during the discharge of the IPA, the controller 4 may set off an alarm. In some occasions, the controller 4 may stop the discharge of the IPA from the nozzle 22 by switching the opening/closing valves 722 and 732 into the discharging standby state. In this case, the substrate W being processed may be temporarily stored in an appropriate place (for example, on the spin chuck 21 of the liquid processing device 2) with the liquid film of the IPA attached to the surface thereof. When the IPA with the low DO becomes available, the IPA with the high DO on the surface of the substrate may be replaced with the IPA with the low DO, and a supercritical drying processing may be performed on the substrate W.

Further, as explained above, there is a risk that a metal component may be eluted from the DO sensor into the IPA. For this reason, when the IPA stays in the branch supply line 716 for a long period of time (over a preset time or more) near the DO sensor at the second position, it is desirable to perform the dummy dispensing regardless of the detection value of the DO sensor so that all of the IPA near the corresponding DO sensor may be drained.

The third position of the DO sensor is on a drain line (drain pipe) 763 branched off from the IPA supply line 762 at a branch point 761 set on the IPA supply line 762. By opening an opening/closing valve 765 provided in the drain line 763 while closing the opening/closing valve 764 provided in the IPA supply line 762, the IPA flowing through the IPA supply line 762 can be sent into the drain line 763. The DO sensor at the third position is configured to measure the dissolved oxygen concentration in the IPA flowing in the drain line 763. The IPA that has passed through the drain line 763 is wasted into the organic chemical liquid drain path, which is provided in the semiconductor manufacturing factory where the substrate processing system 1 is provided. The reason for providing the DO sensor in the drain line 763 is to suppress the IPA containing the metal component eluted from the DO sensor from flowing into the tank 702.

A detection value of the DO sensor provided at the third position may be used to check whether there is a problem with the quality (DO value) of the IPA supplied from the IPA source 41. The substrate processing system 1 according to the present disclosure does not have devices configured to remove the dissolved oxygen in the IPA. Thus, if the IPA source 41 is provided as a factory supply, what needs to be done is to notify a factory manager of the abnormality and to wait for a response therefrom. In the meantime, the operation of the substrate processing system 1 is stopped by, for example, the controller 4. If the IPA source 41 is the airtight container such as a canister, the IPA in the airtight container or the airtight container itself is replaced.

The DO sensors may be provided at all of the first to third positions, but it is not necessary to provide the DO sensors at all of those positions.

In one appropriate exemplary embodiment, the DO sensor is provided at the second position, but not at the first position. During the normal operation of the substrate processing system 1 in which each liquid processing device 2 is operating, the IPA always flows through the branch return line 730, so the IPA circulating through the circulation system (the system including the tank 702, the circulation line 704, the return line 734, etc.) can be drawn out into the drain line 736 at any time by switching the opening/closing valves 722 and 732. Further, even if the DO value of the IPA (remaining IPA) in the branch supply line 716 between the branch point 728 and the nozzle 22 is somewhat high, almost no problem may occur. This is because the IPA supplied to the substrate W from the nozzle 22 at an initial stage of a replacement process (replacement from DIW to IPA) is scattered to the outside of the substrate W together with the DIW on the substrate W without being left on the substrate W. If the DO value of the above-described remaining IPA is a problem, the dummy dispensing needs to be performed. Thus, by regularly checking the detection value of the DO sensor at the second position, it is substantially guaranteed that the IPA with the low DO value is supplied to the substrate W. Therefore, there is no need to provide the DO sensor at the first position.

The advantage of providing the DO sensor at the third position lies in that the above-described troubleshooting can be performed promptly, and the DO value of the IPA supplied to the substrate W needs to be checked by the DO sensor at the second position (or the DO sensor at the first position). Thus, if it is ensured that the DO value of the IPA supplied from the IPA source 41 (for example, a factory power supply) is sufficiently low, the DO sensor at the third position does not need to be provided.

The detection value of the DO sensor is transmitted to the controller 4. The controller 4 performs, based on the received detection value, various operations such as starting the liquid processing in the liquid processing device 2 (starting the supply of the processing liquid such as IPA to the nozzle 22), stopping the liquid processing (stopping the supply of the processing liquid such as IPA to the nozzle 22), setting forth an alarm that notifies the operator of the abnormality in the detection value of the DO sensor, and so forth, as described above.

In the pipes (lines) illustrated in the pipeline system diagram of FIG. 11, when the IPA that has passed through a certain pipe is not discarded (in other words, when the corresponding IPA is to be discharged from the nozzle 22 later), that pipe is classified as a supply pipe. On the other hand, when the IPA that has passed through a certain pipe is discarded (in other words, the corresponding IPA is not supplied to the nozzle 22), that pipe is also called a drain pipe, and many of drain pipes are branch pipes that are branched off from the supply pipe. In the exemplary embodiment of FIG. 11, the drain lines 736 and 763 and the drain line 766 correspond to the drain pipes.

In the first configuration example shown in FIG. 5 as well, a DO sensor (indicated by a dashed-lined rectangle) may be provided in the IPA supply pipe 46 (for example, upstream and in the vicinity of the nozzle 22, or upstream and in the vicinity of the opening/closing valve 462). A detection value obtained by this DO sensor may also be used by the controller 4 to determine the necessity of the dummy dispensing, to monitor the DO value of the IPA discharged from the nozzle 22 onto the substrate W, and so forth. In this case as well, the DO sensor may be provided in a drain line (not shown) branched off from the IPA supply pipe 46, the same as the DO sensors at the first and third positions of FIG. 11 described above.

Until the substrate W is carried into the supercritical chamber 31 of the supercritical processing device 3 after the IPA puddle is formed on the surface of the substrate W in the liquid processing device 2, oxygen may be dissolved in the IPA. In order to suppress this, it is desirable that a transfer path for the substrate W ranging from the spin chuck 21 of the liquid processing device 2 to the supercritical chamber 31 of the supercritical processing device 3 is maintained in a nitrogen gas atmosphere (inert gas atmosphere). As a specific example, when the IPA starts to be supplied to the surface of the substrate W in the liquid processing device 2, the nitrogen gas is discharged from the FFU 28 (see FIG. 2). Also, a nitrogen gas is supplied from the nitrogen gas supply 163 (see FIG. 1) into the substrate transfer path 162 to maintain the substrate transfer path 162 in the nitrogen gas atmosphere. Additionally, the nitrogen gas is supplied from the nitrogen gas supply 36 (see FIG. 1) to the region 35 of the supercritical processing device 3 to maintain the region 35 in the nitrogen gas atmosphere.

According to the above-described exemplary embodiment, the dissolved oxygen in the IPA puddle formed on the surface of the substrate W can be suppressed to a low level, so that the pattern collapse due to the generation of the bubbles from the dissolved oxygen can be suppressed.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to provide the technique capable of preventing or at least suppressing the collapse of the pattern formed on the surface of the substrate when the supercritical drying processing is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:

a liquid processing device, having a nozzle, configured to perform a processing on a substrate by supplying a processing liquid onto the substrate from the nozzle, the liquid processing device forming a liquid film of the processing liquid on a surface of the substrate as a pre-process for a supercritical drying processing of drying the processing liquid;

a processing liquid supply configured to supply the processing liquid to the nozzle, the processing liquid supply comprising:

a buffer tank configured to temporarily store therein the processing liquid supplied from a processing liquid source;

a supply pipe, through which the processing liquid passes from the processing liquid source toward the nozzle, configured to connect the processing liquid source, the buffer tank and the nozzle; and a supply controller configured to at least perform a supply and a stop of the supply of the processing liquid to the nozzle;

a dissolved oxygen concentration measuring device provided in the supply pipe or in a drain pipe branched off from the supply pipe, and configured to measure a dissolved oxygen concentration in the processing liquid present in the supply pipe or in the processing liquid taken out from the supply pipe through the drain pipe; and a controller configured to determine whether or not to supply the processing liquid from the nozzle to the substrate based on a measurement result of the dissolved oxygen concentration measuring device, and configured to control the supply controller based on a determination result, wherein the controller is configured to control the supply of the processing liquid such that the processing liquid supplied to the substrate has a dissolved oxygen concentration lower than a preset concentration, wherein the processing liquid is isopropyl alcohol (IPA).

2. The substrate processing apparatus of claim 1, further comprising:

an enclosing member configured to surround a member, in which the processing liquid is present, in at least a portion of a section between the processing liquid source and the nozzle; and an inert gas supply configured to supply an inert gas to an inside of the enclosing member.

3. The substrate processing apparatus of claim 2, wherein the pipe is configured as a dual-pipe having an inner pipe and an outer pipe, the processing liquid flows in the inner pipe, the inert gas flows in a space between the outer pipe and the inner pipe, and the outer pipe serves as the enclosing member.

4. The substrate processing apparatus of claim 2, wherein the enclosing member is configured to surround, in at least the portion of the section between the processing liquid source and the nozzle, the pipe and a device provided in the pipe altogether, and the device is one or more devices selected from a group consisting of a valve, a filter, a flowmeter, and a temperature controller.

5. The substrate processing apparatus of claim 2, wherein the enclosing member is configured to surround, in at least the portion of the section between the processing liquid source and the nozzle, a device provided in the pipe, and the device is one or more devices selected from a group consisting of a valve, a filter, a flowmeter, and a temperature controller.

6. The substrate processing apparatus of claim 2, wherein the enclosing member is configured to surround the buffer tank.

7. The substrate processing apparatus of claim 2, further comprising:

a circulation line connected to the buffer tank, wherein the processing liquid is supplied to the nozzle through a branch supply line branched off from the circulation line, and the circulation line and the branch supply line constitute a part of the pipe.

8. The substrate processing apparatus of claim 7, wherein the dissolved oxygen concentration measuring device is provided in at least one of the drain pipe constituting a drain line branched off from a pipe between the processing liquid source and the buffer tank, the supply pipe constituting the branch supply line, or the drain pipe constituting a drain line branched off from a return line which is branched off from the branch supply line to return the processing liquid into the circulation line.

9. The substrate processing apparatus of claim 1, wherein the buffer tank comprises a tank main body storing the processing liquid therein, and an inert gas supply port and a processing liquid discharge port provided in the tank main body, and the buffer tank is configured to discharge the processing liquid from the processing liquid discharge port by supplying an inert gas from the inert gas supply port to pressurize an internal space of the tank main body.

10. The substrate processing apparatus of claim 2, further comprising:

a supercritical processing device configured to dry, with a supercritical fluid, the substrate, the liquid film of the processing liquid being formed on the surface of the substrate by the liquid processing device;

a transfer device configured to transfer the substrate from the liquid processing device to the supercritical processing device; and an additional inert gas supply configured to supply an inert gas into a space through which the substrate passes when the substrate is transferred from the liquid processing device to the supercritical processing device, to set the space into an inert gas atmosphere.

11. The substrate processing apparatus of claim 2, wherein the inert gas is a nitrogen gas.

12. The substrate processing apparatus of claim 2, wherein the processing liquid is isopropyl alcohol (IPA).

13. The substrate processing apparatus of claim 3, wherein the processing liquid is isopropyl alcohol (IPA).

14. The substrate processing apparatus of claim 5, wherein the processing liquid is isopropyl alcohol (IPA).

15. A substrate processing method performed in a substrate processing apparatus, wherein the substrate processing apparatus comprises:

a liquid processing device, having a nozzle, configured to perform a processing on a substrate by supplying a processing liquid onto the substrate from the nozzle, the liquid processing device forming a liquid film of the processing liquid on a surface of the substrate as a pre-process for a supercritical drying processing of drying the processing liquid;

a processing liquid supply configured to supply the processing liquid to the nozzle, the processing liquid supply comprising:

a buffer tank configured to temporarily store therein the processing liquid supplied from a processing liquid source;

a supply pipe, through which the processing liquid passes from the processing liquid source toward the nozzle, configured to connect the processing liquid source, the buffer tank and the nozzle; and a supply controller configured to at least perform a supply and a stop of the supply of the processing liquid to the nozzle; and a dissolved oxygen concentration measuring device provided in the supply pipe or in a drain pipe branched off from the supply pipe, and configured to measure a dissolved oxygen concentration in the processing liquid present in the supply pipe or in the processing liquid taken out from the supply pipe through the drain pipe, and wherein the substrate processing method comprises;

performing a liquid processing on the substrate by determining whether or not to supply the processing liquid from the nozzle to the substrate based on a measurement result of the dissolved oxygen concentration measuring device, and controlling, when it is determined that the processing liquid is to be supplied, the supply controller to supply the processing liquid from the nozzle onto the substrate in the liquid processing device, wherein the determining whether or not to supply the processing liquid includes determining whether the dissolved oxygen concentration of the processing liquid is lower than a preset concentration, and the processing liquid is supplied to the substrate when the dissolved oxygen concentration is lower than the preset concentration, wherein the processing liquid is isopropyl alcohol (IPA).

16. The substrate processing method of claim 15, wherein the substrate processing apparatus configured to perform the substrate processing method further comprises an enclosing member configured to surround, in at least a portion of a section between the processing liquid source and the nozzle, a member in which the processing liquid is present, and the substrate processing method performs a processing on the substrate by supplying the processing liquid onto the substrate from the nozzle while supplying an inert gas to an inside of the enclosing member to prevent or suppress oxygen from being dissolved in the processing liquid present in the member.

17. The substrate processing method of claim 16, wherein the inert gas is a nitrogen gas.

* * * * *